United States Patent
Wijekoon et al.

(10) Patent No.: US 8,152,981 B2
(45) Date of Patent: Apr. 10, 2012

(54) METHODS AND COMPOSITIONS FOR ELECTROPHORETIC METALLIZATION DEPOSITION

(75) Inventors: Kapila P. Wijekoon, Palo Alto, CA (US); Timothy Weidman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1121 days.

(21) Appl. No.: 12/015,410

(22) Filed: Jan. 16, 2008

(65) Prior Publication Data

US 2009/0178927 A1 Jul. 16, 2009

(51) Int. Cl.
*C25D 13/10* (2006.01)
*H01B 1/02* (2006.01)
(52) U.S. Cl. ......... 204/486; 204/487; 252/512; 252/513
(58) Field of Classification Search ............... 204/486, 204/487; 252/512, 513
See application file for complete search history.

(56) References Cited

U.S. PATENT DOCUMENTS

5,374,495 A * 12/1994 Ata et al. .................. 430/109.3
7,545,557 B2 * 6/2009 Iftime et al. .................. 359/296
* cited by examiner

*Primary Examiner* — Kishor Mayekar
(74) *Attorney, Agent, or Firm* — Patterson & Sheridan, LLP (57) ABSTRACT

Embodiments of the invention generally provide methods and compositions that are used during electrophoretic deposition (EPD) processes. In one embodiment, a method for forming a metallization material during an EPD process is provided which includes positioning a substrate containing apertures disposed thereon, exposing the substrate to a flux agent to form a flux coating within the apertures, exposing the flux coating to an EPD mixture to form a particulate layer therein, and exposing the substrate to a reflow process to form a metallization layer within the apertures. Optionally, the particulate layer may be exposed to the flux agent prior to the reflow process. The EPD mixture generally contains a dielectric hydrocarbon fluid, metallic particles, and a liquid crystal material (LCM), such as a cholesteryl compound. In some embodiments, an abietic acid compound may be used as the flux agent, or alternatively, as the LCM.

29 Claims, 10 Drawing Sheets

FIG. 5B ic METHODS AND COMPOSITIONS FOR
ELECTROPHORETIC METALLIZATION
DEPOSITION

BACKGROUND OF THE INVENTION

1. Field of the Invention

Embodiments of the invention generally relate to the manufacturing of photovoltaic cells and particularly to the processes and compositions used during an electrophoretic deposition process.

2. Description of the Related Art

Solar cells are photovoltaic devices that convert sunlight directly into electrical power. The most common solar cell material is silicon, which is in the form of single or polycrystalline wafers. Because the amortized cost of forming silicon-based solar cells to generate electricity is higher than the cost of generating electricity using traditional methods, there has been an effort to reduce the cost to form solar cells.

Figure 1A:
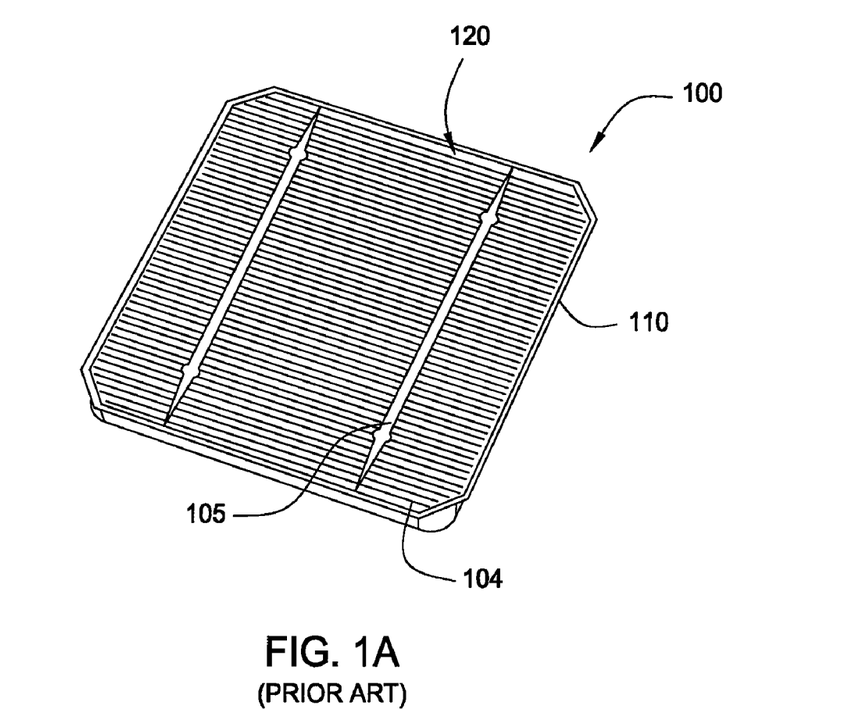
FIG. 1A illustrates an isometric view of prior art solar cell containing a front side metallization interconnect pattern.
Figure 1B:
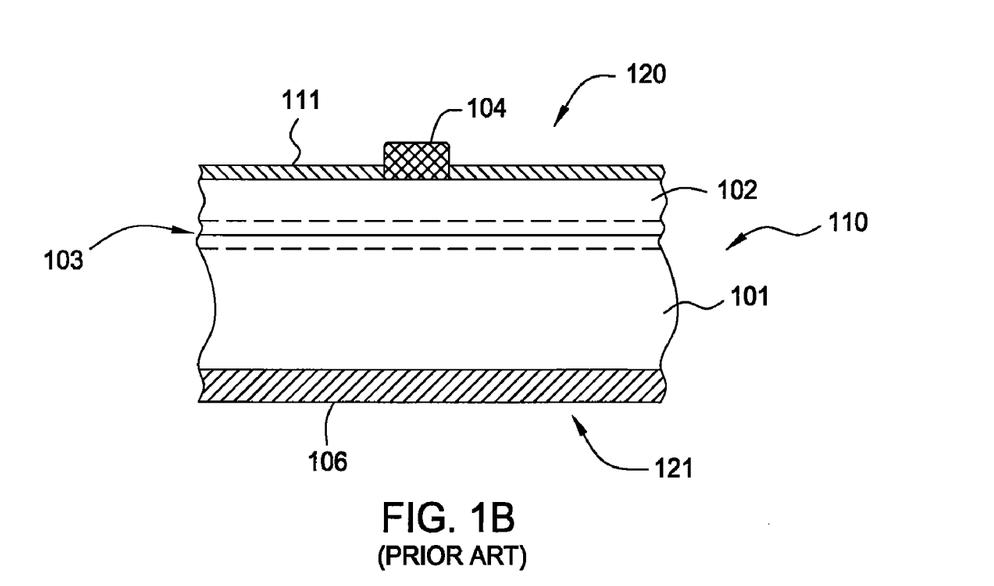
FIG. 1B illustrates a cross-sectional side view of a prior art solar cell shown in FIG. 1A.

FIGS. 1A and 1B schematically depict a standard silicon solar cell 100 fabricated on a wafer 110. The wafer 110 includes a p-type base region 101, an n-type emitter region 102, and a p-n junction region 103 disposed therebetween. An n-type region, or n-type semiconductor, is formed by doping the semiconductor with certain types of elements (e.g., P, As, or Sb) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus the dopant atom can accept an electron from a neighboring atoms' covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 103. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 120, i.e. the light-receiving side, and the backside 121 of the solar cell 100. The top contact structure, as shown in FIG. 1A, is generally configured as widely-spaced thin metal lines, or fingers 104, that supply current to a larger busbar 105. The back contact 106 is generally not constrained to be formed in multiple thin metal lines, since it does not prevent incident light from striking solar cell 100. Solar cell 100 is generally covered with a thin layer of dielectric material, such as $S_{12}N_4$, to act as an anti-reflection coating 111, or ARC, to minimize light reflection from the top surface of solar cell 100.

In the interest of simplified assembly and higher efficiency of solar cells, a solar cell has been developed, wherein a plurality of holes is formed through the solar cell substrate and serves as vias for interconnection of the top contact structure to a backside conductor by using pins. This solar cell design is referred to as a pin-up module, or PUM. One advantage of the PUM concept is the elimination of the busbars, such as busbar 105 illustrated in FIG. 1A, from covering the light-receiving side of the substrate, thereby increasing efficiency of the cell. Another is that resistive losses are reduced because current produced by the solar cell is collected at holes equally spaced over the substrate rather than requiring some of the connections to extend across the surface of the solar cell. Further, resistive losses experienced by a PUM connected device will not increase as the solar cell surface area increases and, hence, larger solar cells may be manufactured without a loss in efficiency.

Figure 1C:
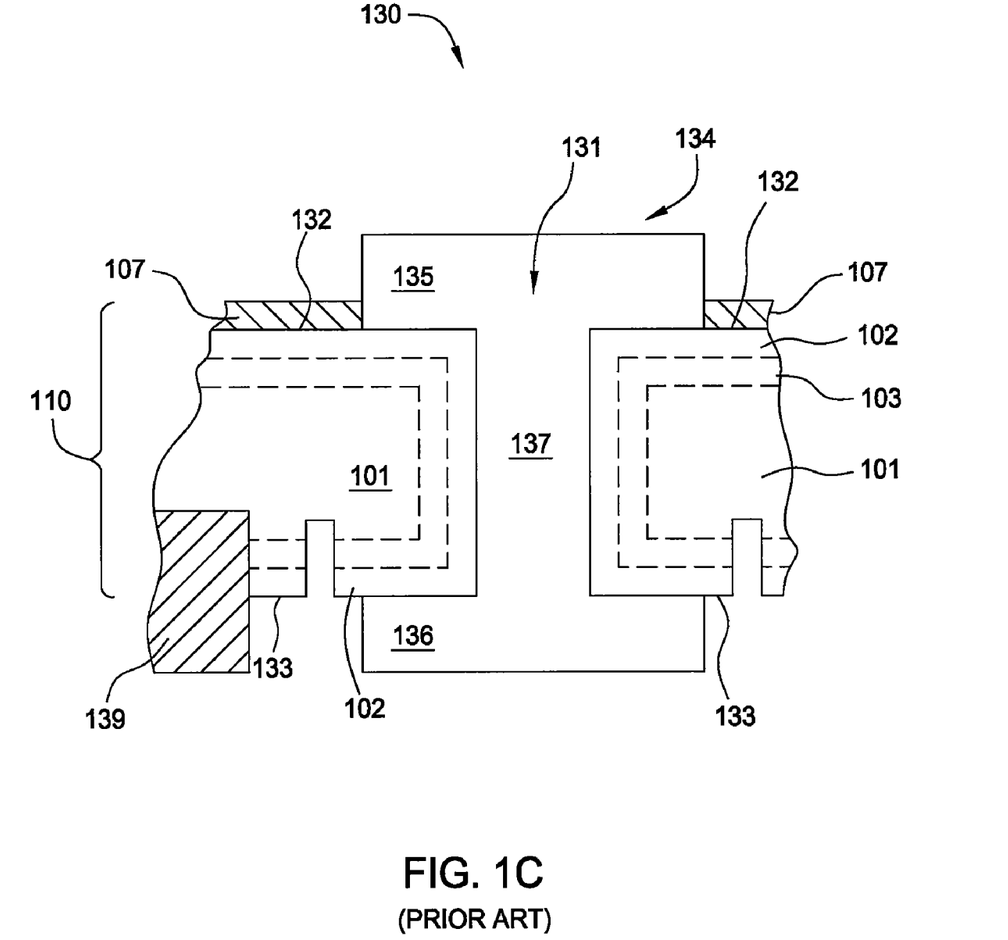
FIG. 1C illustrates a cross-sectional view of a prior art PUM type device.

FIG. 1C is a partial schematic cross section of one example of a PUM cell 130 showing a contact 134. Similar to a standard solar cell, such as solar cell 100, PUM cell 130 includes a single crystal silicon wafer 110 with a p-type base region 101, an n-type emitter region 102, and a p-n junction region 103 disposed therebetween. PUM cell 130 also includes a plurality of through-holes 131, which are formed between the light-receiving surface 132 and the backside 133 of PUM cell 130. The through-holes 131 allow the formation of contact 134 between the light-receiving surface 132 and the backside 133. Disposed in each through-hole 131 is a contact 134, which includes a top contact structure 135 disposed on light-receiving surface 132, a backside contact 136 disposed on backside 133, and an interconnect 137, which fills through-hole 131 and electrically couples top contact structure 135 and backside contact 136. An anti-reflective coating 107 may also be formed on light-receiving surface 132 to minimize reflection of light energy therefrom. A backside contact 139 completes the electrical circuit required for PUM cell 130 to produce a current by forming an ohmic contact with p-type base region 101 of wafer 110.

The fingers 104 (FIG. 1B) or contact 134 (FIG. 1C) are in contact with the substrate and are adapted to form an ohmic connection with doped region (e.g., n-type emitter region 102). An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. Hence, after the fingers 104, or contacts 134, have been formed on the light-receiving surface and on the backside, an annealing process of suitable temperature and duration is typically performed in order to produce the necessary low resistance metal silicide at the contact/semiconductor interface.

Figure 1D:
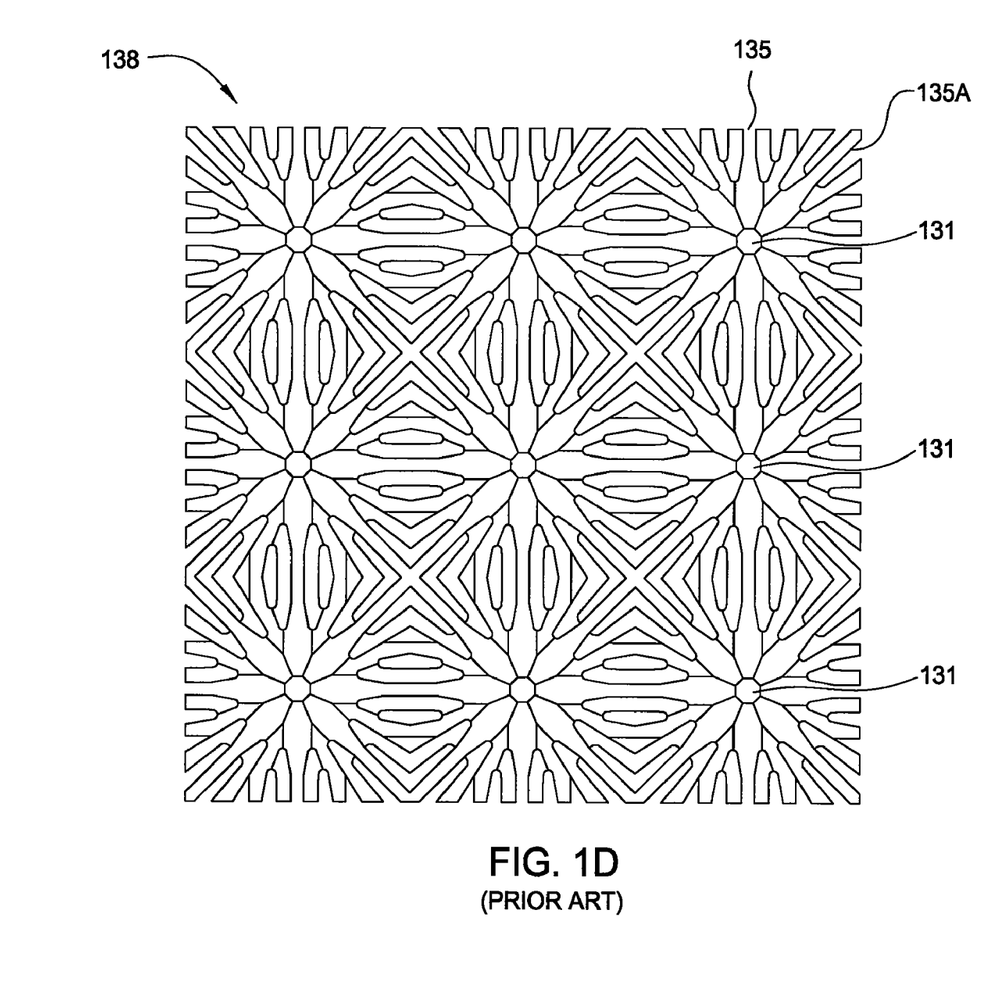
FIG. 1D illustrates a plan view of a top contact structure of a PUM cell, wherein the finger width and geometry have been optimized to maximize cell efficiency.

Wider current-carrying metal lines (e.g., fingers 104, contact 134) on the light-receiving surface of the solar cell yield lower resistance losses, but shadowing losses are higher due to the reduced effective surface area of the light-receiving surface. Therefore, maximizing solar cell efficiency requires balancing these opposing design constraints. FIG. 1D illustrates a plan view of one example of a top contact structure 135 for a PUM cell, wherein the finger width and geometry have been optimized to maximize cell efficiency. In this configuration, a top contact structure 135 for a PUM cell is configured as an electrode 138, which consists of a plurality of various width finger segments 135A. The width of a particular finger segment 135A is selected as a function of the current to be carried by that finger segment 135A. In addition, finger segments 135A are configured to branch as necessary to maintain finger spacing as a function of finger width. This minimizes resistance losses as well as shadowing by finger segments 135A.

Traditionally, the current carrying metal lines, or conductors, are fabricated using a screen printing process in which a metal-containing paste is deposited in a desired pattern on a substrate surface and then annealed to fuse the metal. Frequently, the metal used is silver. During the annealing process, the metal paste may not agglomerate into a continuous interconnecting line. This can cause discontinuous metal fingers, resulting in unusable cells. Also, porosity present in the fingers formed during the agglomeration process can result in increased resistive losses. Moreover, electrical shunts may be formed by diffusion of the metal (e.g., silver) from the contact into the p-type base region or on the surface of the substrate backside. Shunts on the substrate backside are caused by poor definition of backside contacts due to waviness, and/or metal residue. Furthermore, due to the relatively thin substrate thicknesses commonly used in solar cell applications, such as 200 μm and less, the act of screen printing the metal paste on the substrate surface can cause physical damage to the substrate. Finally, commonly-used silver-based paste is a relatively expensive material for forming conductive components of a solar cell.

The screen printing process of forming the patterned features requires high temperature post-processing steps to densify the formed features and ensure good electrical contact with the substrate surface. Due to the need to perform a high temperature sintering process, the formed interconnect lines may have high extrinsic stress created by the difference in thermal expansion of the substrate material and the metal lines. High extrinsic stress, or even intrinsic stress formed in the metal interconnect lines, can cause breakage of the formed metallized features, warping of the thin solar cell substrate, and/or delamination of the metallized features from the surface of the solar cell substrate. High temperature processes also limit the types of materials that can be used to form a solar cell due to the breakdown of certain materials at the high sintering temperatures. Finally, screen printing processes tend to be non-uniform, unreliable and often unrepeatable.

Another approach to forming very thin, robust current carrying metal lines on the surface of a solar cell substrate involves cutting grooves in the surface of the substrate with a laser. The grooves are subsequently filled by an electroless plating method, such as wave soldering. However the laser-cut grooves are a source of macro- and micro-defects. The laser-cut edge is not well defined, causing waviness on the finger edges, and the heat of the laser introduces defects into the silicon.

Electrophoretic deposition (EPD) processes have been used to form various metallic features including metal lines. However, most EPD processes use polymer coated metallic particles, which introduces the polymeric coatings and other contaminants into the metallic lines. Also, deposited metallic features contain less metallic particles per volume due to the polymer coating. Conductive contacts with a void fraction of about 20% to about 30%, or greater, are usually formed by EPD processes that use polymer coated particles. Also, polymer coated particles may the source of undesirable, polymeric contaminants within the conductive contact.

The resistance of interconnects formed in a solar cell device greatly affects the efficiency of the solar cell. It is thus desirable to form a solar cell device that has a low resistance connection that is reliable and cost effective. Interconnecting lines of silver, usually formed from a silver paste, has been a popular material for forming interconnects. However, while silver has a lower resistivity (e.g., $1.59 \times 10^{-8}$ ohm-m) than other common metals such as copper (e.g., $1.67 \times 10^{-8}$ ohm-m) and aluminum (e.g., $2.82 \times 10^{-8}$ ohm-m), silver is usually cost prohibiting to utilize in a commercial setting compared to much less expensive copper and aluminum.

Therefore, there is a need for a low cost method of forming a contact structure for solar cells that has low resistivity, clearly defined features, and a strong bond and good electrical contact with the surface of the substrate. There is also a need for an electrophoretic deposition process and composition used to form a reliable interconnecting layer while maintaining a low cost.

SUMMARY OF THE INVENTION

Embodiments of the invention generally provide methods and compositions that are used during electrophoretic deposition (EPD) processes. In one embodiment, a method for forming a metallization material during an EPD process is provided which includes positioning a substrate containing apertures disposed thereon, exposing the substrate to a flux agent to form a flux coating within the apertures, exposing the flux coating to an EPD mixture to form a particulate layer therein, and exposing the substrate to a reflow process to form a metallization layer within the apertures. Optionally, the particulate layer may be exposed to the flux agent prior to the reflow process. The EPD mixture generally contains a dielectric hydrocarbon fluid, metallic particles, and a liquid crystal material (LCM), such as a cholesteryl compound. In some embodiments, an abietic acid compound may be used as the flux agent, or alternatively, as the LCM.

In another embodiment, a method for forming a metallization material during an electrophoretic deposition process is provided which includes positioning a substrate containing apertures disposed thereon, exposing the substrate to a flux agent containing an abietic acid compound to form a flux coating within the apertures, and exposing the flux coating to an EPD mixture to form a particulate layer therein. The EPD mixture may contain a dielectric hydrocarbon fluid, metallic particles, and a cholesteryl compound. The method further provides exposing the particulate layer to the flux agent to form a second flux coating, and subsequently, exposing the substrate comprising the second flux coating to a reflow process to form a metallization layer within the apertures.

In one example, the flux agent contains an abietic acid compound. In another example, the EPD mixture further contains a charging agent. The charging agent may be a metal sulfonate compound, such as a sulfonate of barium, calcium, magnesium, sodium, potassium, cesium, lithium, or mixtures thereof. In one example, the metallic particles contain at least one metal, such as copper, silver, gold, tin, cobalt, nickel, zinc, lead, palladium, platinum, aluminum, lead-tin, silver-tin, copper-tin, tin-silver-copper (SAC-alloy), tin-silver-copper-bismuth, alloys thereof, or combinations thereof. In another example, the metallic particles contain tin and at least one other metal, such as lead, copper, cobalt, silver, alloys thereof, or combinations thereof.

Examples provide that the cholesteryl compound is a cholesteryl ester compound, such as stearate, oleate, linoleate or linolenate, palmitate or palmitoleate, derivatives thereof, salts thereof, and combinations thereof. In one example, the cholesteryl ester compound is cholesteryl stearate with a melting point within a range from about 75° C. to about 85° C. In another example, the cholesteryl ester compound is cholesteryl oleate with a melting point within a range from about 40° C. to about 50° C.

In other embodiments, a composition of an electrophoretic deposition solution is provided which includes a dielectric hydrocarbon fluid, metallic particles suspended within the dielectric hydrocarbon fluid, a liquid crystal material containing a cholesteryl compound, and a charging agent. Alternatively, in another embodiment, a composition of an electrophoretic deposition solution is provided which includes a dielectric hydrocarbon fluid, metallic particles suspended within the dielectric hydrocarbon fluid, a liquid crystal material containing an abietic acid compound, and a charging agent.

The dielectric hydrocarbon fluid usually contains an aliphatic hydrocarbon, an aromatic hydrocarbon, derivatives thereof, or combinations thereof. In one example, the metallic particles contain at least one metal, such as copper, silver, gold, tin, cobalt, nickel, zinc, lead, palladium, platinum, aluminum, lead-tin, silver-tin, copper-tin, SAC-alloy, tin-silver-copper-bismuth, alloys thereof, or combinations thereof. In another example, the metallic particles contain tin and at least one other metal, such as lead, copper, cobalt, silver, alloys thereof, or combinations thereof. The metallic particles may contain a bare, metallic surface. In some examples, the charging agent may be a metal sulfonate compound, such as a sulfonate of barium, calcium, magnesium, sodium, potassium, cesium, lithium, or mixtures thereof.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a low cost solar cell using a novel deposition method and apparatus to form a metal contact structure having selectively formed metal lines using an electrophoretic deposition (EPD) process. The apparatus and methods described herein remove the need to perform one or more screen printing processes to form conductive features on the surface of a solar cell substrate. Solar cell substrates that may benefit from the invention include substrates composed of single crystal silicon, multi-crystalline silicon, polycrystalline silicon, germanium, and gallium arsenide, cadmium telluride, cadmium sulfide, copper indium gallium selenide, copper indium selenide, gallium indium phosphide, as well as heterojunction cells, such as GaInP/GaAs/Ge or ZnSe/GaAs/Ge substrates. The solar cell substrates may be formed in a square, rectangular, circular, or other desirable shapes.

Figure 2:
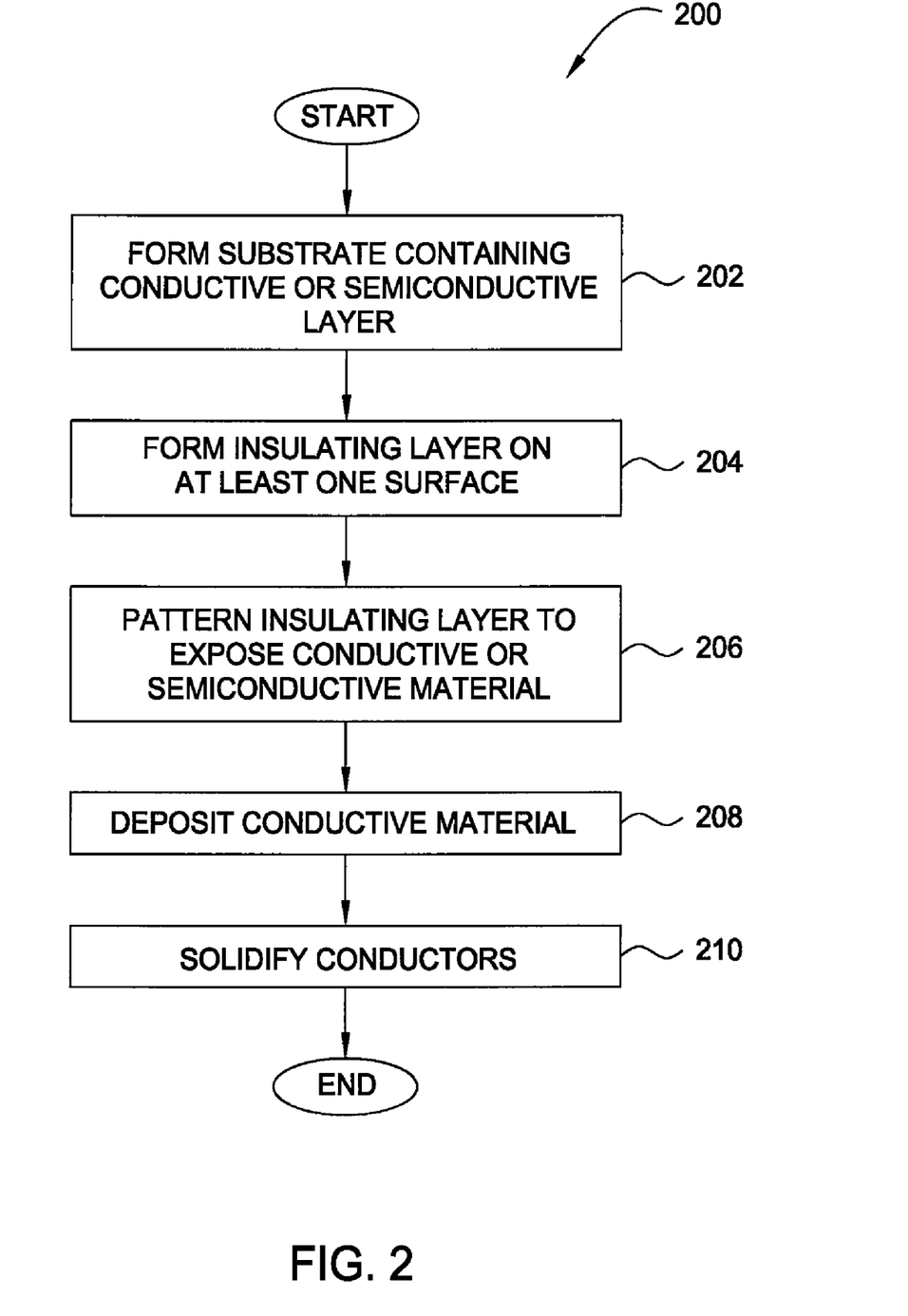
FIG. 2 illustrates a solar cell process sequence according to one embodiment described herein.

FIG. 2 is a process flow diagram that illustrates a series of method steps 200 that are used to form contact structures on a solar cell device using the apparatus described herein. The processes described below may be used to form a solar cell having interconnects formed using any conventional device interconnection style or technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM, multilayer buried contact structures, back-surface contacts (both electrical contacts on one side), may be formed using the apparatus and methods described herein without varying from the basic scope of the invention.

Figure 3A:
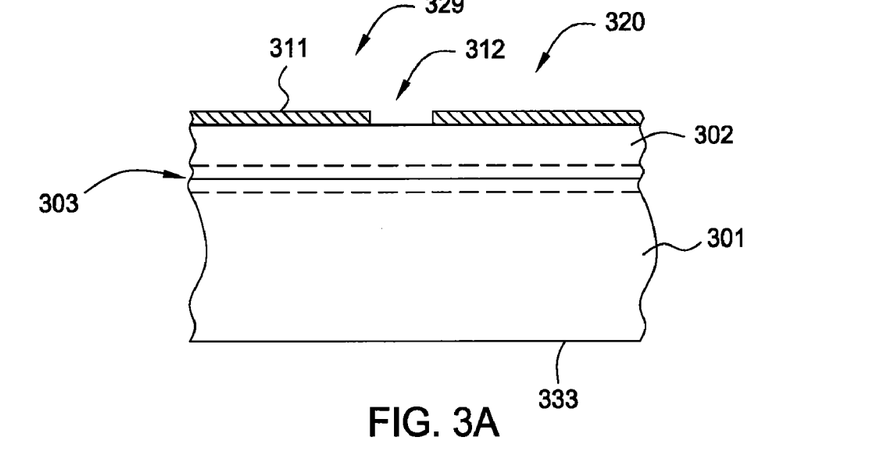
FIGS. 3A-3C illustrate schematic cross-sectional views of a solar cell during different stages of the process sequence described in FIG. 2.
Figure 3B:
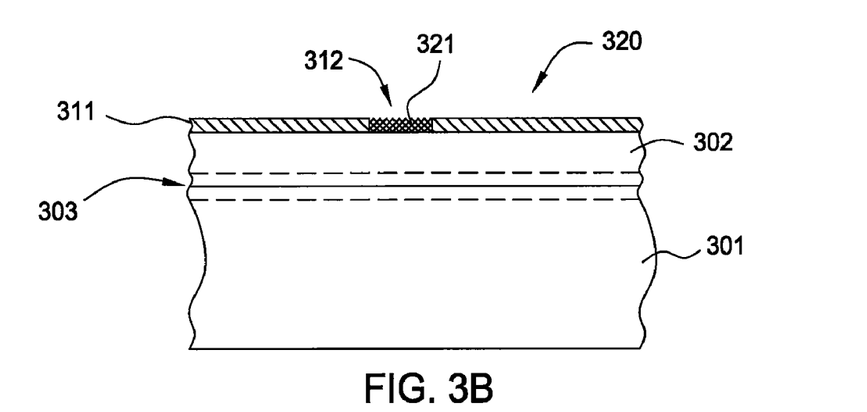
Figure 3C:
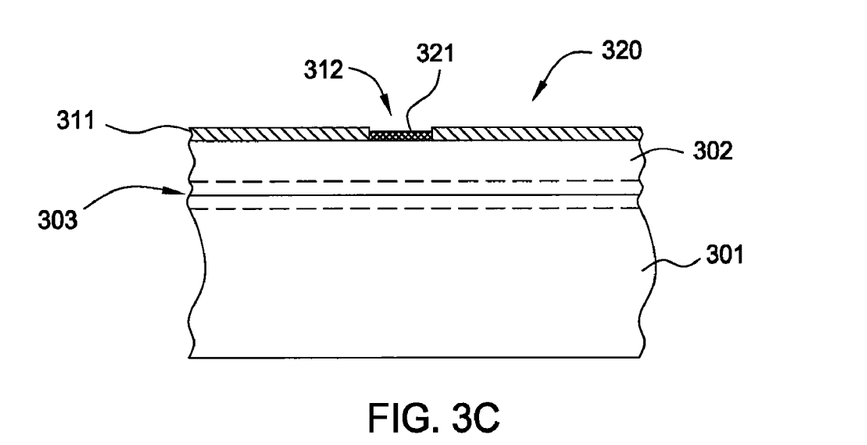

FIGS. 3A-3C illustrate the various states of a metallized substrate 320 after each step of method steps 200 has been performed. The method steps 200 start with step 202 in which a substrate 301 (FIG. 3A) is formed using conventional solar cell and/or semiconductor fabrication techniques. The substrate 301 may be formed from single crystal or polycrystalline silicon materials, and may have conductive layers and semiconductive layers. Examples of these substrate fabrication processes include the edge-defined, film-fed growth (EFG) process, as described in U.S. Pat. No. 5,106,763, the ribbon growth on substrate (RGS) process, as described in U.S. Pat. Nos. 4,670,096 and 5,298,109, and DE 4,105,910, and the silicon sheets from powder (SSP) ribbon process, as described in U.S. Pat. Nos. 5,336,335, 5,496,446, 6,111,191, and U.S. Pat. No. 6,207,891. In one example, an n-type region 302 is disposed over the substrate 301 that has been doped with a p-type dopant. The n-type region 302 can be formed using conventional chemical vapor deposition (CVD) process, by driving-in an n-type dopant using a diffusion furnace, or other similar doping or film deposition techniques. The formed p-n junction will form a p-n junction region 303.

In the next step, step 204, as shown in FIG. 2, a mask layer 311 may be formed over desired regions of the substrate surface using a conventional selective deposition process, such as an electroless or selective CVD deposition process. The mask layer 311, illustrated in FIG. 3A, prevents deposition on areas where such deposition may be unwanted. In step 206, the mask layer is patterned. Using a patterned mask layer allows deposition of conductive lines on the substrate. Patterning of mask layer 311 forms aperture 312, exposing n-type region 302. Patterning mask layer 311 generally exposes conductive or semiconductive materials beneath the mask layer.

In the next step, step 208, as shown in FIG. 2, conductors are formed over exposed conductive or semiconductive portion of the substrate. Deposition may be electrochemical, electrostatic, or electrophoretic. FIG. 3B illustrates a plurality of conductive metallic particles 321 formed in aperture 312 through an electrophoretic deposition process as described herein. The metallic particles are deposited by a process of electrophoresis and are held in place by electrostatic forces. Substrate 320 is fully exposed to the processing medium from which the metallic particles are deposited. Such exposure may be accomplished by immersing the substrate in the medium or preferably by distributing the medium onto a surface of the substrate in such a way that the entire surface is exposed to the medium. Substrate 320 may be exposed to processing medium for an amount of time to deposit the desired amount of material, such as between about 10 seconds and about 10 minutes, e.g. about 20 seconds. Substrates may be exposed to the processing medium one at a time or in batches. An electric field may be applied to speed the deposition process.

In the next step, step 210, as shown in FIG. 2, metallic particles 321 in aperture 312 are solidified together in a high-temperature reflow process that results in solid conductors. Remnants of components of the processing medium used to deposit the metallic particles evaporate or are combusted to yield metal wires. Such removal step may accompany the reflow process or may precede it. Removal of sacrificial components of the processing medium may thus be done at the same temperature as the reflow process, or at a different temperature. If, as described below, a hydrocarbon fluid is used as the ambient fluid, it may be desirable to remove the residual fluid by evaporation prior to solidifying the conductors. This may be done in the same apparatus as the reflow process by heating the substrates to a first temperature for a predetermined first period of time to evaporate the hydrocarbon, then to a second temperature for a predetermined second period of time to solidify the conductor. Alternately, the removal step may be performed in a different apparatus from the reflow process.

In another embodiment, a process for forming conductive contacts from multiple metal species is provide and includes depositing a first conductive material according to the embodiment described herein. Subsequently, second conductive material may be formed on or over the first conductive material by exposing the substrate to another masking process, another deposition process, and another solidifying process. Additional cycles may be used to deposit on obverse surfaces, or further conductive materials.

Deposition Apparatus

Figure 4A:
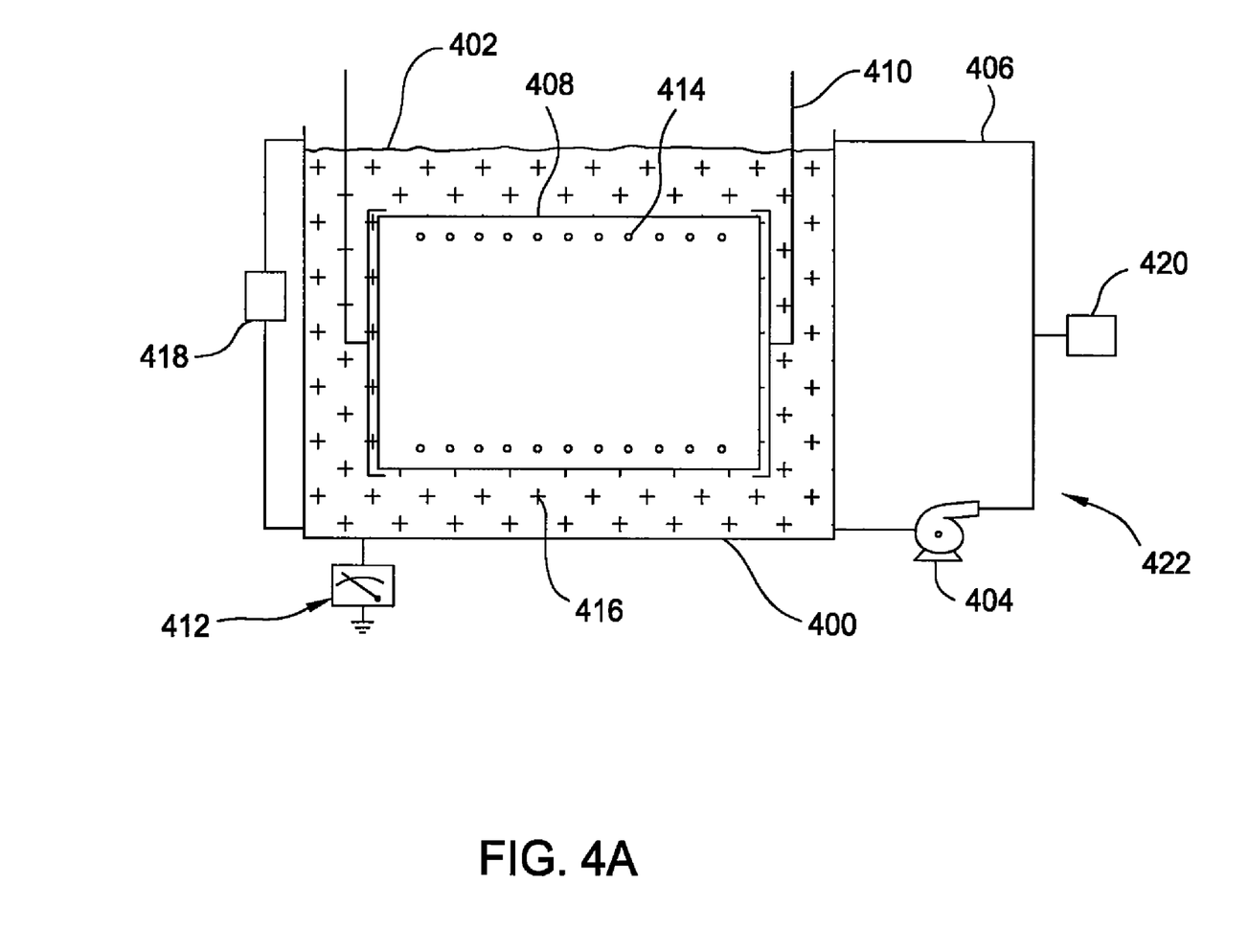
FIGS. 4A-4C are schematic diagrams of an apparatus according to one embodiment of the invention.
Figure 4B:
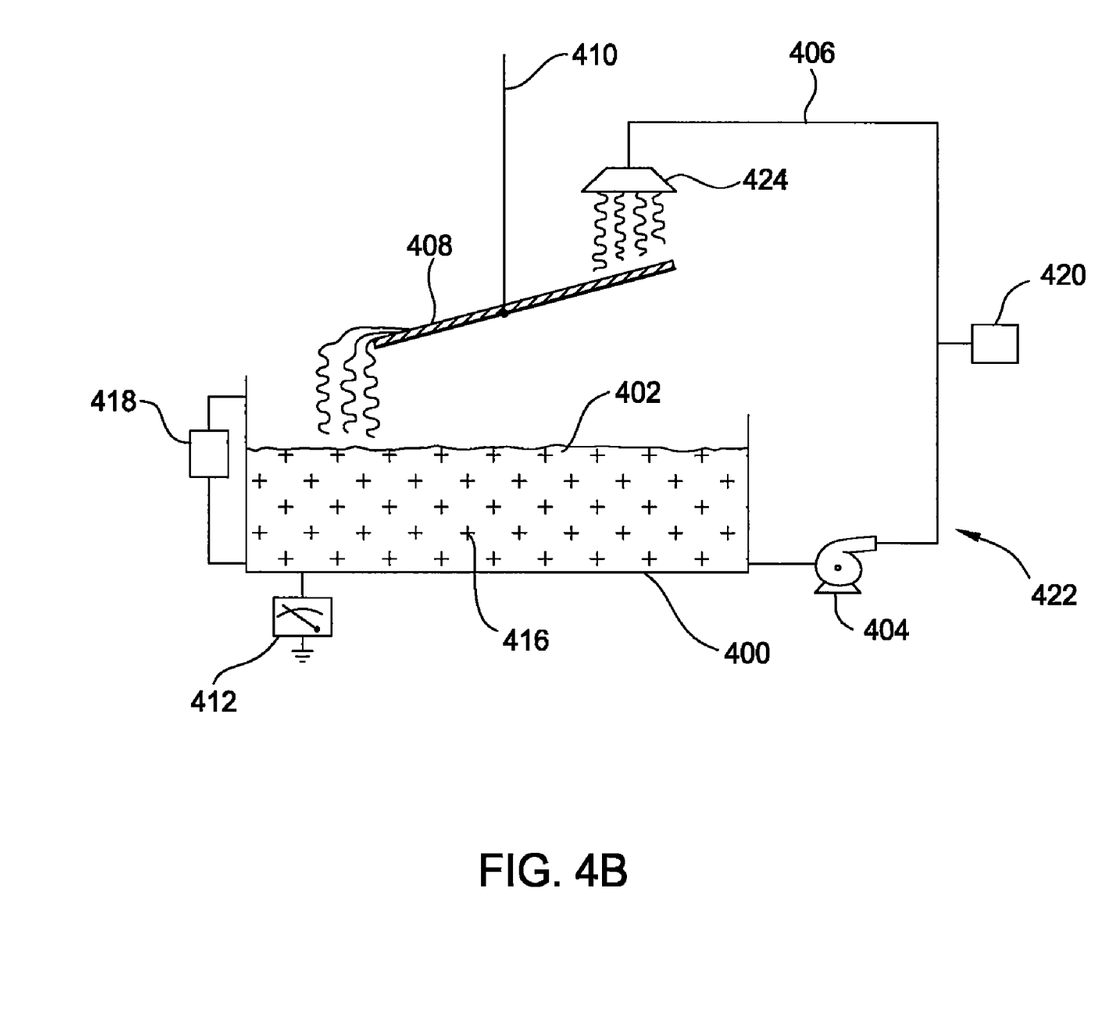
Figure 4C:
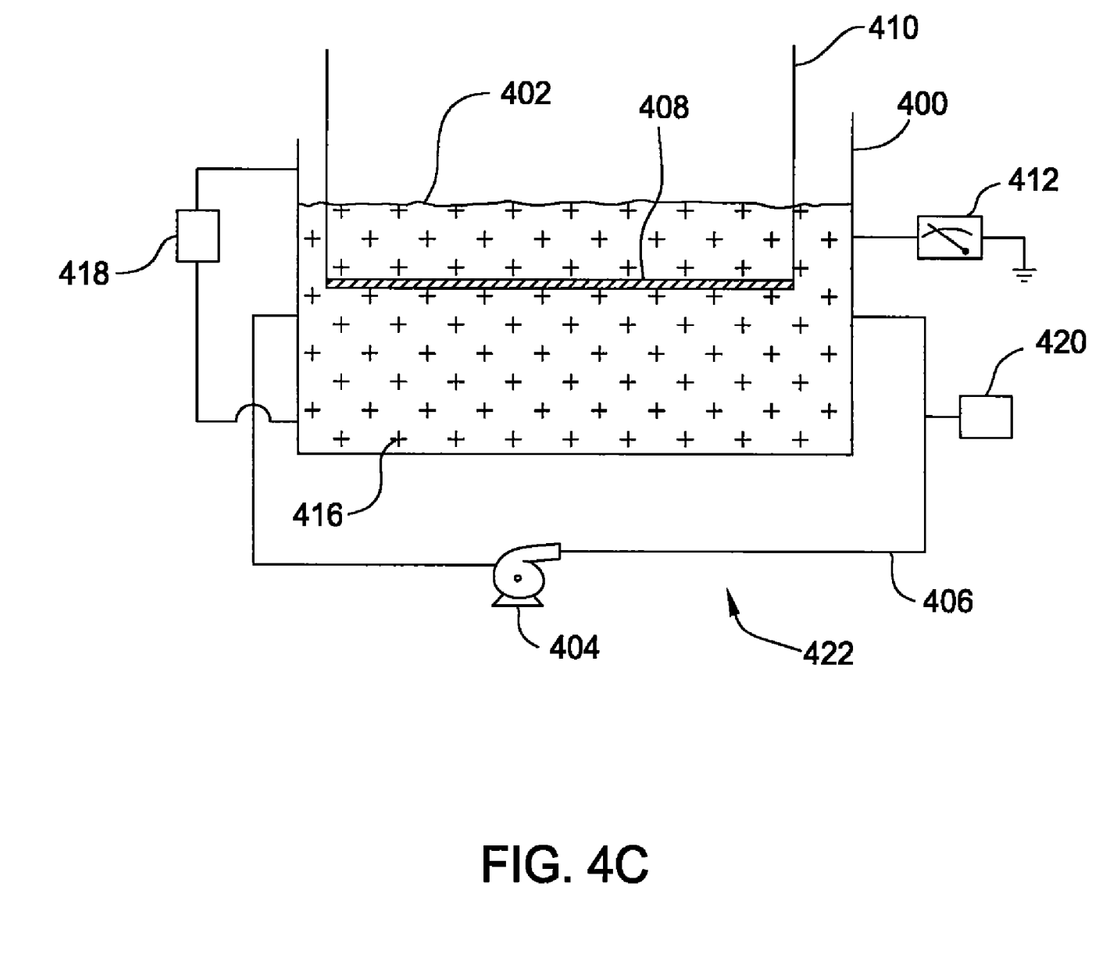

FIGS. 4A-4C illustrate an apparatus according to one embodiment of the invention. In FIG. 4A, a processing container 400 is provided in which a processing medium 402 is held. Processing container 400 may be a tank, and is preferably sized to accommodate at least one entire substrate. Processing medium 402 may be an electrolyte solution or preferably a dielectric suspension of charged metallic particles. A delivery system 422, containing at least a pump 404 and piping 406, pumps medium 402 around through piping 406 to container 400 to circulate the medium. A substrate 408 is held by substrate holder 410 in a position to facilitate exposure of substrate 408 to medium 402. Substrate holder 410 is preferably configured to hold substrate 408 in a fixed position during processing. Substrate 408 may be immersed in medium 402, as shown in FIGS. 4A and 4C, or it may be held above container 400 while medium 402 is distributed to a surface of substrate 408. In embodiments wherein electrical isolation of the substrate is desired, substrate holder 410 may be made of or coated with electrically insulating material. When grounding or other electrical coupling of the substrate is desired, holder 410 may be made of or coated with conductive material. In one embodiment, a grounded conductive substrate holder may promote electrostatic deposition of conductive material onto substrate 408.

FIG. 4B illustrates an embodiment in which substrate 408 is held by substrate holder 410 in a position such that medium 402 can be distributed to one surface of the substrate. Piping 406 features a distributor 424 configured to apply processing medium across the entire surface of substrate 408. As shown in FIG. 4B, processing container 400 may be smaller in embodiments wherein substrate 408 is held outside the container. In such embodiments, container 400 may be a collection basin holding only enough fluid to feed pump 404. FIG. 4C illustrates an alternate embodiment in which substrate 408 is immersed in medium 402 horizontally, preferably face-up, and medium 402 is caused to flow across substrate 408 from one side of container 400 to the other by the pumping action of pump 404. Apertures 414 in substrate 408 expose conductive or semi-conductive materials at points on which conductors are to be formed. If an electrolyte solution is used, substrate 408 must be electrically biased relative to an electrode, not shown. If a dielectric suspension is used, charged metallic particles 416 in solution 402 are attracted to holes 414 in substrate 408 by a difference in electric potential of particles 416 and substrate 408, and are held in place by electrostatic forces.

A controller 412 may optionally be provided to monitor of electric potential of medium 402, if convenient. Controller 412 may be a potentiometer in some embodiments. A controller 418 may optionally be provided to monitor volume of processing medium 402 in container 400. In some embodiments, controller 418 may be a pressure differential instrument for monitoring volume of a medium within a container. Controller 420 may also be used for monitoring compositions of processing medium 402, such as for determining the concentrations of depleted or consumed compounds within the composition during a deposition process.

In one embodiment, if a dielectric suspension is used as the processing medium 402, suspended metallic particles 416 may be electrostatically charged, or an electrical bias applied to substrate 408 with an electrode, or both. The metallic particles may be charged by immersing them in a dielectric fluid to form a dielectric suspension. Medium 402, for example, may be formed by dispersing metallic particles from a dielectric fluid.

Tank 400, pump 404, and piping and valves 406 are preferably all lined with an insulating material, such as plastic. This plastic lining may be a fluorinated polymer, such as polytetrafluoroethylene (PTFE), such as TEFLON® or any other plastic material. Glass or ceramic may also be used as a non-conductive lining. As processing medium 402 is pumped through lined pump 404 and piping and valves 406, static charge builds due to frictional charging. The static charge localizes on the metallic particles dispersed in medium 402. If an electrode is not used, a static charge giving rise to a bulk electrostatic potential of greater than about 10 kV, such as within a range from about 15 kV to about 20 kV, may be used during the process. Individual electrically charged particles are attracted to exposed conductive or semi-conductive portions of substrate 408, for example through apertures 414, to deposit on the substrate. An electrode may be used in combination with electrostatic charging to accelerate deposition. Use of an electrode in combination with a dielectric suspension, as described above, may also enable deposition without prior charging of the medium.

In a single-cell process embodiment using a dielectric fluid with metallic particles as the processing medium, pumping the processing medium continuously through piping 406 will maintain a static charge on the dispersed metallic particles. Charging may be monitored using a controller of convenient design, such as a potentiometer. Substrates may be exposed to the processing medium one after another in a semi-continuous deposition process or in batches. As conductive material is depleted from the processing medium, more must be added continuously to maintain deposition rate. Composition of the processing medium may be monitored by an analyzer 420, for example an orifice meter correlated to specific gravity, to determine the rate at which material must be added. Over time, the ambient portion of the processing medium will also be depleted by evaporating or by adhering to substrates as they are transported to a solidifying apparatus. Instrument 418 may be used to determine when more ambient material must be added to the processing medium.

Other embodiments of single-substrate processing systems are contemplated. One such apparatus incorporates a substrate carrier to transport substrates between and within processing stations. Substrates may be exposed to processing medium one or more times while being carried through the processing apparatus. The same carrier may then transport substrates to drying and/or reflow stations. Multiple substrates may thus be carried, one after the other, through the various steps of the process. A conveyor is an example of a substrate carrier that may be used in some embodiments. Substrates may be carried by a conveyor past one or more distributors 424. Each distributor may deliver different processing media to enable stage-wise deposition of different materials, if desired. Each processing station may be independently energized with an electric field, if so desired, to aid deposition. Deposited materials may be solidified in a single reflow station after all deposition is complete, or reflow stations may be interspersed between deposition stations or other processing stations. In some embodiments, conveyors may be configured to provide more than one substrate to a single processing station at one time.

Batch Apparatus

Figure 5A:
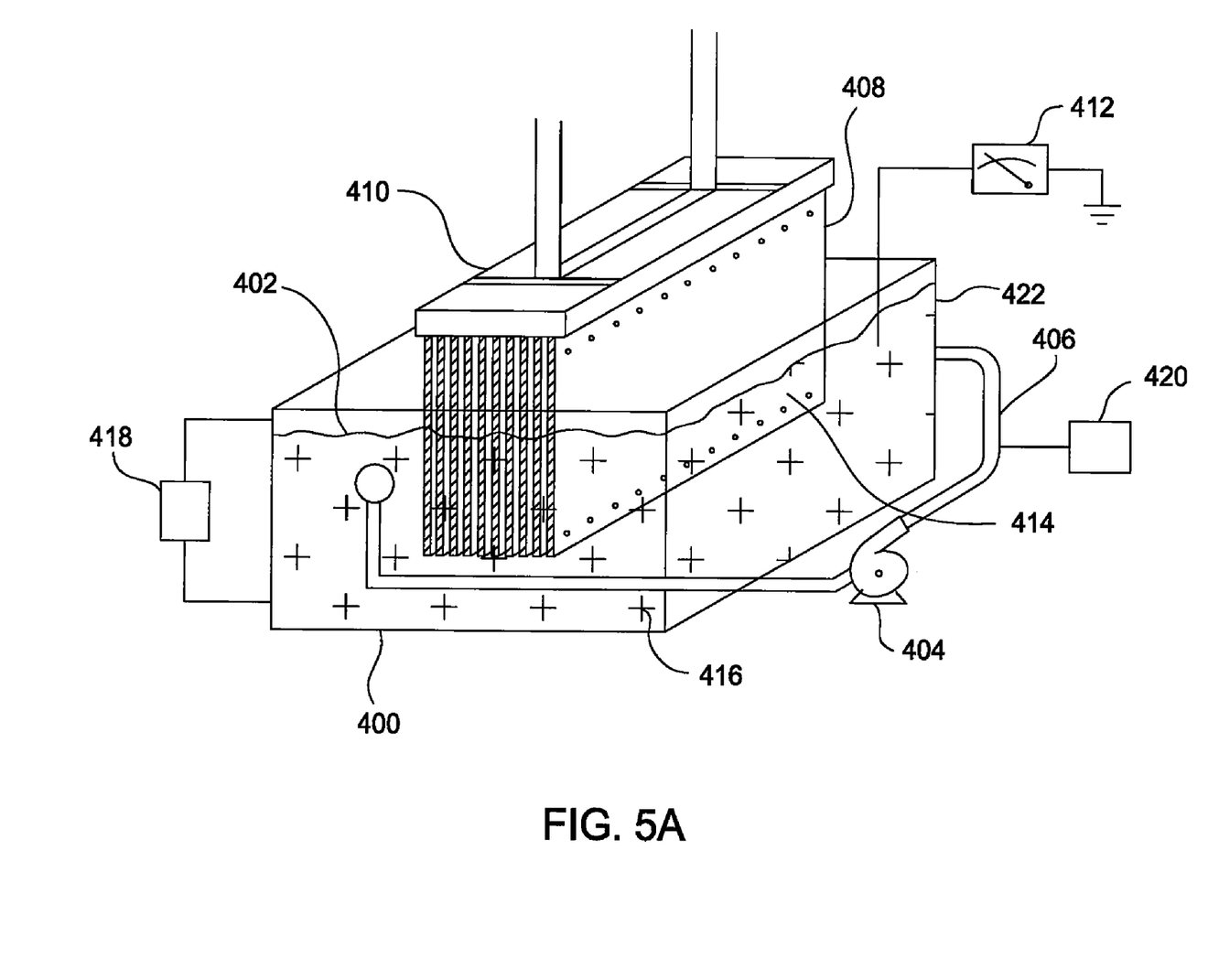
FIG. 5A is an isometric view of an apparatus for processing solar cell substrates according to one embodiment of the invention.
Figure 5B:
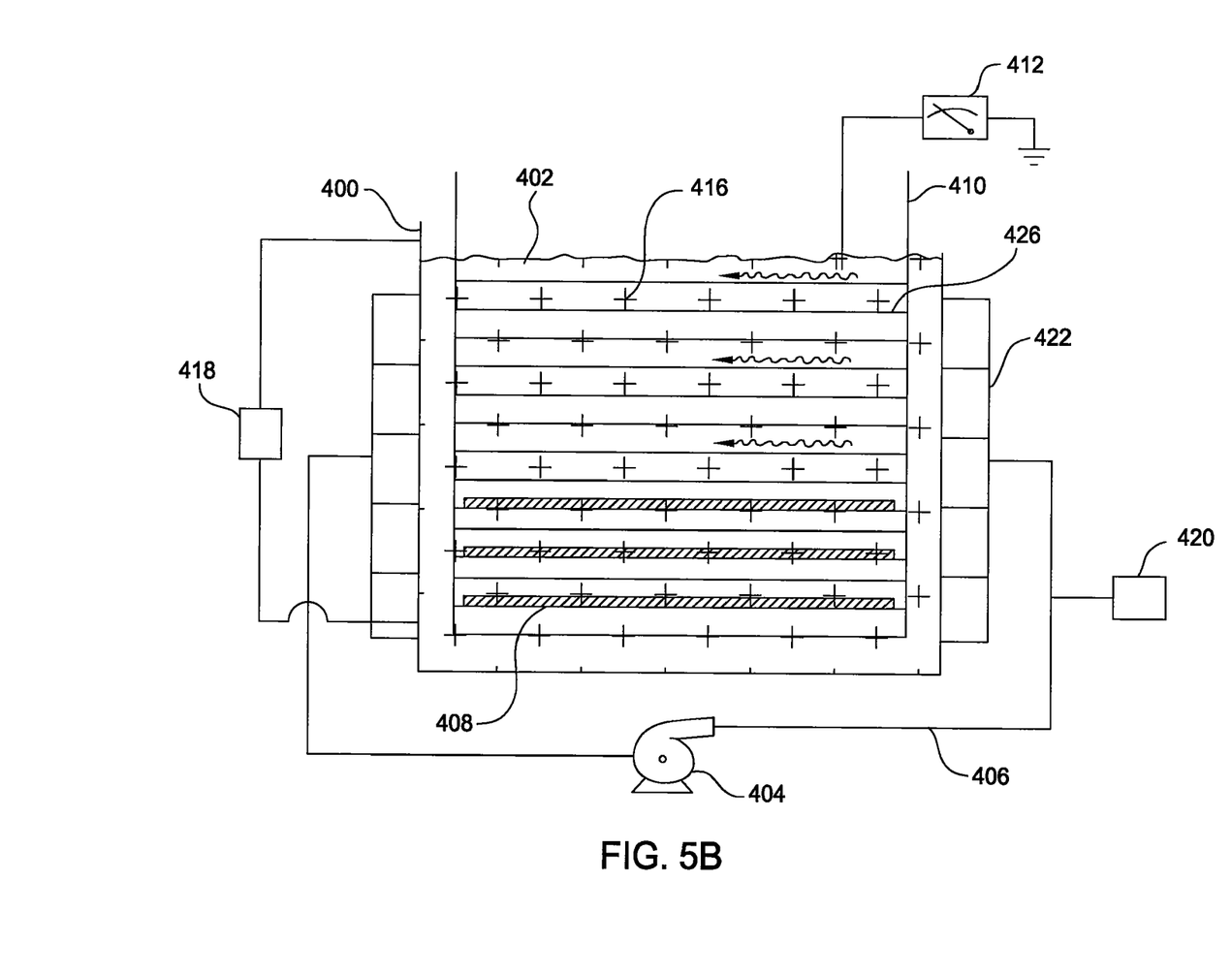
FIG. 5B is a cross-sectional side view an apparatus for processing solar cell substrates according to one embodiment of the invention.

FIGS. 5A and 5B illustrate alternative apparatus embodiments that may be used to process multiple substrates at the same time. FIG. 5A shows an embodiment in which multiple substrates are immersed in a processing medium by dipping. Container 400 is sized to accept the desired number of substrates 408. Although in this embodiment substrates 408 are shown partially immersed in processing medium 402, total immersion is also contemplated wherein holder 410 is partially or fully immersed in processing medium 402 as well. In some embodiments, substrate holder 410 may comprise a plurality of edge grippers, one for each substrate. Holder 410 may also comprise a single edge gripping device for all substrates. Holder 410 may also be configured to grip substrates along their entire length through any known means, such as friction, vacuum, or electrostatic means. Delivery system 422 is shown in a configuration designed to create flow of processing medium 402 longitudinally across substrates 408. As above, delivery system 422 and container 400 are lined with non-conductive material to facilitate frictional charging of particles 416. In alternate embodiments, however, particles 416 may be electrically neutral, and an electric field may be applied to medium 402 to encourage deposition.

FIG. 5B illustrates another embodiment for processing multiple substrates. Similar elements are labeled with similar numbers. In this embodiment, substrate holder 410 features trays 426 for carrying multiple substrates. Each substrate rests on a tray, and the trays are exposed to the processing medium 402. Delivery system 422 and piping 406 are configured to cause processing medium 402 to flow across substrates 408 to achieve uniform deposition. The apparatus in FIG. 5B is preferably operated without an additional applied electric field to maximize uniformity of deposition. Trays may be solid, perforated, or edge supports.

Processing Medium and EPD Process

Embodiments of the invention provide methods and compositions that are used during electrophoretic deposition (EPD) processes. In one embodiment, a method for forming a metallization material during an EPD process is provided which includes positioning a substrate containing apertures disposed thereon, exposing the substrate to a flux agent to form a flux coating within the apertures, and exposing the flux coating to an EPD mixture to form a particulate layer therein. The EPD mixtures is also known as a processing medium or a dielectric suspension. In one example, the EPD mixture contains a dielectric hydrocarbon fluid, metallic particles, and a liquid crystal material (LCM), such as a cholesteryl compound. The method further provides exposing the substrate to a reflow process to form a metallization layer within the apertures.

A fluxing agent and a dielectric suspension may be used to form metallization or other metal-containing layers during EPD processes described in embodiments herein. A substrate may be exposed to the flux agent prior to the deposition process, as well as thereafter. The flux agent may be used to coat the surface of the substrate, such as the apertures formed therein during a step before exposing the substrate to the dielectric suspension containing the metallic particles. Optionally, the flux agent may be added to facilitate fusing processes following deposition. It has been found that the flux agent facilitates formation of low resistivity contacts by promoting wetting of metallic particles on conductive surfaces and by minimizing void spaces in solidified contacts. The flux agent may be added at several different times during the process, but best results have been obtained by adding flux into the apertures (e.g., vias, holes, or opening) of the contacts prior to adding the dielectric suspension. It is believed this order allows flux to disperse on the surfaces of the apertures and once the subsequently added metallic particles are added into the apertures, the flux becomes fully and intimately in contact with the suspended metallic particles.

In one embodiment, conductive contacts and other metallic layers may be formed after a reflow process with a void fraction or porosity of about 10% or less, preferably, about 8% or less, and more preferably, about 5% or less. In one example, the void fraction or porosity may be within a range from about 0.5% to about 8%, preferably, from about 1% to about 6%, and more preferably, from about 2% to about 4%.

In one embodiment, the dielectric suspension contains a dielectric fluid which is preferably an electrically insulating fluid with a low dielectric constant, a low vapor pressure and viscosity, and a minimum toxicity. The dielectric fluid may have a resistivity of greater than about $1 \times 10^{10}$ $\Omega/cm^2$, preferably, about $1 \times 10^{11}$ $\Omega/cm^2$ or greater. The dielectric fluid may have a dielectric constant of less than about 5, preferably, about 3.5 or less.

The dielectric fluid may contain a hydrocarbon, such as an aliphatic hydrocarbon (e.g., isoparaffinic solvents) or an aromatic hydrocarbon (e.g., naphtha functional group), derivatives thereof, or combinations thereof. In one example, the dielectric fluid contains a paraffinic solvent composition characterized as mixtures of $C_8$-$C_{20}$ paraffins (e.g., n-paraffins and isoparaffins), with the isoparaffins containing predominantly methyl branching and an isoparaffin:n-paraffin ratio sufficient to provide the dielectric fluid with a predetermined melting temperature, low viscosity, and other properties. In another example, the dielectric fluid contains a paraffinic solvent constituted almost entirely of $C_{10}$-$C_{15}$ linear, or normal paraffins (n-paraffins). In another example, a mixture of isoparaffins of about 8 carbon atoms per molecule to about 20 carbon atoms per molecule (e.g., $C_8$-$C_{20}$), preferably, from about 10 carbon atoms per molecule to about 16 carbon atoms per molecule (e.g., $C_{10}$-$C_{16}$). Examples of dielectric fluids include ISOPAR® or NORPAR®, both available from ExxonMobil, Corp., located in Baytown, Tex., or SHELL-SOL® or SOL-TROL®, available from Shell Chemical Co.

The dielectric suspension contains metallic powder or metallic particles that are electrically conductive and are contained or suspended within the dielectric fluid. The metallic particles may contain copper, silver, gold, tin, cobalt, nickel, zinc, lead, palladium, platinum, aluminum, lead-tin, silver-tin, copper-tin, tin-silver-copper (SAC-alloys), tin-silver-copper-bismuth, alloys thereof, or combinations thereof. In one example, the metallic particles contain the tin-silver-copper alloy, SAC305, which is $Sn_{96.5}Ag_{3.0}Cu_{0.5}$. In another example, the metallic particles contain tin with at least another metal, such as lead, copper, cobalt, or silver. In one embodiment, the metallic particles contain no initial coating thereon, such as a polymeric coating.

In one embodiment, the metallic powder or particles contained or suspended within the dielectric suspension may be substantially a pure metal or a metal alloy. In another embodiment, the metallic particles may have a bare, metallic surface, such that the metallic particles are free of polymeric materials. The metallic particles may have a particle size with an average diameter of about 30 μm or less, such as within a range from about 1 μm to about 20 μm, preferably, from about 2 μm to about 10 μm, and more preferably, from about 3 μm to about 8 μm.

Embodiments provide that the dielectric suspension contains at least one liquid crystal material (LCM). The LCM chelates or coats the metallic particles within the dielectric suspension. The LCM should have a low melting point, such as at less than about 100° C., preferably, about 90° C. or less. The LCM may contain cholesteryl compounds, such as cholesteryl ester compounds of stearate, oleate, linoleate or linolenate, palmitate or palmitoleate, derivatives thereof, or combinations thereof. In another embodiment, abietic acid and abietic acid derivatives may also be utilized as a LCM.

In one example, the dielectric suspension contains cholesteryl stearate, with a melting point within a range from about 75° C. to about 85° C., preferably, from about 79° C. to about 83° C. In another example, the dielectric suspension contains cholesteryl oleate, with a melting point within a range from about 40° C. to about 50° C., preferably, from about 44° C. to about 47° C.

The dielectric suspension may contain a charging agent in some embodiments. The charging agent may facilitate development of electrostatic charge on the particles dispersed in the processing medium. Charging agents that may be used are usually chelators or chelated metal complexes, such as metal carboxylates, metal thiolates, metal sulfonates, alkali metal soaps, block copolymers, fatty amines, zwitterionic compounds, polymeric esters, derivatives thereof, or combinations thereof. In one embodiment, the charging agent is a metal sulfonate compound or a mixture thereof wherein the metal is barium, calcium, magnesium, sodium, potassium, cesium, or lithium. Examples of metal sulfonate compounds that may be used as the charging agent include barium sulfonate, sodium sulfonate, calcium sulfonate, magnesium sulfonate, and mixtures thereof, and are commercially available as barium, sodium, calcium, or magnesium PETRONATE®, from Chemtura, Corp., located in Middleton, Conn.

The dielectric suspension, containing the dielectric fluid, the metallic particles, and the LCM, is heated to a temperature that is greater than the melting point of the LCM. The dielectric suspension may be heated to a temperature of about 100° C. or less, such as within a range from about 25° C. to about 95° C., preferably, from about 40° C. to about 70° C., for example, about 60° C. during a heating process. Thereafter, the dielectric suspension is cooled to a temperature of about room temperature, such as within a range from about 20° C. to about 25° C.

A charging agent is added into an electrophoretic deposition (EPD) cell which contains a substrate therein. The cooled dielectric suspension mixture is subsequently transferred into the EPD cell to begin the EPD process. Subsequent the deposition, the deposited metallic particles on the substrate may be exposed to the flux agent, that is, the flux agent may be applied to the filled structures. Thereafter, the substrate is positioned in a reflow chamber and the solder particles are sintered or densified during a densification or reflow process. In one example, the EPD process is used to fill various features on a solar cell device with metal/solder particles.

While the foregoing is directed to embodiments of the invention, other and further embodiments of the invention may be devised without departing from the basic scope thereof, and the scope thereof is determined by the claims that follow.

What is claimed is:

1. A method for forming a metallization material during an electrophoretic deposition EPD process, comprising:
   positioning a substrate comprising apertures disposed thereon;
   exposing the substrate to a flux agent to form a flux coating within the apertures;
   exposing the flux coating to an EPD mixture to form a particulate layer by the EPD process therein, wherein the EPD mixture comprises a dielectric hydrocarbon fluid, metallic particles, and a cholesteryl compound; and
   exposing the substrate to a reflow process to form a metallization layer within the apertures.

2. The method of claim 1, wherein the flux agent comprises an abietic acid compound.

3. The method of claim 1, further comprising exposing the particulate layer to the flux agent to form a second flux coating prior to the reflow process.

4. The method of claim 1, wherein the EPD mixture further comprises a charging agent.

5. The method of claim 4, wherein the charging agent comprises a metal sulfonate compound.

6. The method of claim 5, wherein the metal sulfonate compound comprises barium, calcium, magnesium, sodium, potassium, cesium, lithium, or mixtures thereof.

7. The method of claim 1, wherein the metallic particles comprise at least one metal selected from the group consisting of copper, silver, gold, tin, cobalt, nickel, zinc, lead, palladium, platinum, aluminum, lead-tin, silver-tin, copper-tin, tin-silver-copper (SAC-alloy), tin-silver-copper-bismuth, alloys thereof, and combinations thereof.

8. The method of claim 1, wherein the metallic particles comprise tin and at least one metal selected from the group consisting of lead, copper, cobalt, silver, alloys thereof, and combinations thereof.

9. The method of claim 1, wherein the cholesteryl compound is a cholesteryl ester compound.

10. The method of claim 9, wherein the cholesteryl ester compound comprises stearate, oleate, linoleate, linolenate, palmitate, palmitoleate, derivatives thereof, salts thereof, and combinations thereof.

11. The method of claim 10, wherein the cholesteryl ester compound comprises cholesteryl stearate, and the cholesteryl stearate has a melting point within a range from about 75° C. to about 85° C.

12. The method of claim 10, wherein the cholesteryl ester compound comprises cholesteryl oleate, and the cholesteryl oleate has a melting point within a range from about 40° C. to about 50° C.

13. The method of claim 10, wherein the cholesteryl compound comprises cholesteryl stearate or cholesteryl oleate.

14. A method for forming a metallization material during an electrophoretic deposition EPD process, comprising:
- positioning a substrate comprising apertures disposed thereon;
- exposing the substrate to a flux agent comprising an abietic acid compound to form a flux coating within the apertures;
- exposing the flux coating to an EPD mixture to form a particulate layer by the EPD process therein, wherein the EPD mixture comprises a dielectric hydrocarbon fluid, metallic particles, and a cholesteryl compound;
- exposing the particulate layer to the flux agent to form a second flux coating; and
- exposing the substrate comprising the second flux coating to a reflow process to form a metallization layer within the apertures.

15. A composition of an electrophoretic deposition solution, comprising:
- a dielectric hydrocarbon fluid;
- metallic particles suspended within the dielectric hydrocarbon fluid;
- a liquid crystal material comprising a cholesteryl compound; and
- a charging agent.

16. The composition of claim 15, wherein the metallic particles comprise at least one metal selected from the group consisting of copper, silver, gold, tin, cobalt, nickel, zinc, lead, palladium, platinum, aluminum, lead-tin, silver-tin, copper-tin, tin-silver-copper (SAC-alloy), tin-silver-copper-bismuth, alloys thereof, and combinations thereof.

17. The composition of claim 15, wherein the metallic particles comprise tin and at least one metal selected from the group consisting of lead, copper, cobalt, silver, alloys thereof, and combinations thereof.

18. The composition of claim 17, wherein the cholesteryl compound comprises cholesteryl stearate or cholesteryl oleate.

19. The composition of claim 17, wherein the charging agent comprises a metal sulfonate compound.

20. The composition of claim 15, wherein the cholesteryl compound is a cholesteryl ester compound.

21. The composition of claim 20, wherein the cholesteryl ester compound comprises stearate, oleate, linoleate, linolenate, palmitate, palmitoleate, derivatives thereof, salts thereof, and combinations thereof.

22. The composition of claim 21, wherein the cholesteryl ester compound comprises cholesteryl stearate, and the cholesteryl stearate has a melting point within a range from about 75° C. to about 85° C.

23. The composition of claim 21, wherein the cholesteryl ester compound comprises cholesteryl oleate, and the cholesteryl oleate has a melting point within a range from about 40° C. to about 50° C.

24. The composition of claim 15, wherein the metal sulfonate compound comprises barium, calcium, magnesium, sodium, potassium, cesium, lithium, or mixtures thereof.

25. A composition of an electrophoretic deposition solution, comprising:
- a dielectric hydrocarbon fluid;
- metallic particles suspended within the dielectric hydrocarbon fluid;
- a liquid crystal material comprising an abietic acid compound; and
- a charging agent.

26. The composition of claim 25, wherein the metallic particles comprise at least one metal selected from the group consisting of copper, silver, gold, tin, cobalt, nickel, zinc, lead, palladium, platinum, aluminum, lead-tin, silver-tin, copper-tin, tin-silver-copper (SAC-alloy), tin-silver-copper-bismuth, alloys thereof, and combinations thereof.

27. The composition of claim 26, wherein the charging agent comprises a metal sulfonate compound.

28. The composition of claim 27, wherein the metal sulfonate compound comprises barium, calcium, magnesium, sodium, potassium, cesium, lithium, or mixtures thereof.

29. The composition of claim 25, wherein the metallic particles comprise tin and at least one metal selected from the group consisting of lead, copper, cobalt, silver, alloys thereof, and combinations thereof.

* * * * *